(12) United States Patent
Lee

(10) Patent No.: US 11,411,143 B2
(45) Date of Patent: Aug. 9, 2022

(54) LIGHT EMITTING DEVICE AND METHOD OF FABRICATING THE SAME

(71) Applicant: Samsung Display Co., Ltd., Yongin-si (KR)

(72) Inventor: Seung Hoon Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 164 days.

(21) Appl. No.: 16/503,807

(22) Filed: Jul. 5, 2019

(65) Prior Publication Data
US 2020/0013929 A1 Jan. 9, 2020

(30) Foreign Application Priority Data
Jul. 5, 2018 (KR) .......................... 10-2018-0078428

(51) Int. Cl.
*H01L 25/075* (2006.01)
*H01L 33/62* (2010.01)
(Continued)

(52) U.S. Cl.
CPC .............. *H01L 33/42* (2013.01); *H01L 24/95* (2013.01); *H01L 25/0753* (2013.01);
(Continued)

(58) Field of Classification Search
CPC ....... H01L 33/38; H01L 33/385; H01L 33/42; H01L 33/62; H01L 2933/0016;
(Continued)

(56) References Cited

U.S. PATENT DOCUMENTS

| 6,018,167 | A * | 1/2000 | Oota ...................... H05K 3/321 257/99 |
| 2006/0027827 | A1 * | 2/2006 | Tain ...................... H01L 33/486 257/99 |

(Continued)

FOREIGN PATENT DOCUMENTS

| JP | H09162675 A * | 6/1997 |
| KR | 10-2018-0007025 | 1/2018 |
| KR | 10-2018-0009014 | 1/2018 |

OTHER PUBLICATIONS

Definition of "wall", https://www.dictionary.com/browse/wall, accessed Oct. 14, 2021. (Year: 2021).*

(Continued)

*Primary Examiner* — Yu Chen
(74) *Attorney, Agent, or Firm* — Lewis Roca Rothgerber Christie LLP

(57) ABSTRACT

A light emitting device includes a substrate including a light emitting region. A first electrode is in the light emitting region. A second electrode is in the light emitting region and spaced apart from the first electrode. A light emitting element is between the first electrode and the second electrode. A first contact electrode connects an end of the light emitting element to the first electrode. A second contact electrode connects another end of the light emitting element to the second electrode. The first contact electrode and the second contact electrode have a thickness larger than or equal to that of the first electrode and the second electrode.

5 Claims, 16 Drawing Sheets

(51) Int. Cl.
| | |
|---|---|
| *H01L 33/42* | (2010.01) |
| *H01L 27/15* | (2006.01) |
| *H01L 33/00* | (2010.01) |
| *H01L 25/00* | (2006.01) |
| *H01L 23/00* | (2006.01) |
| *H01L 33/38* | (2010.01) |

(52) U.S. Cl.
CPC ............ *H01L 25/50* (2013.01); *H01L 27/156* (2013.01); *H01L 33/005* (2013.01); *H01L 33/38* (2013.01); *H01L 33/62* (2013.01); *H01L 2224/95136* (2013.01); *H01L 2933/0016* (2013.01); *H01L 2933/0066* (2013.01)

(58) Field of Classification Search
CPC ......... H01L 2933/0066; H01L 27/1214; H01L 27/124; H01L 27/1244; H01L 27/1288; H01L 27/15–156; H01L 25/0753; H01L 25/167; H01L 33/20
See application file for complete search history.

(56) References Cited

U.S. PATENT DOCUMENTS

| | | | | |
|---|---|---|---|---|
| 2007/0286773 | A1* | 12/2007 | Schlautmann | ... G01N 27/44791 422/68.1 |
| 2008/0135956 | A1* | 6/2008 | Huber | ....................... H01F 1/26 257/421 |
| 2011/0180799 | A1* | 7/2011 | O'Neill | ............... H01L 29/1029 257/59 |
| 2011/0254043 | A1* | 10/2011 | Negishi | ................... H01L 33/20 257/99 |
| 2013/0027623 | A1* | 1/2013 | Negishi | ............. G02F 1/133603 349/42 |
| 2013/0258663 | A1* | 10/2013 | Woodgate | ................. F21K 9/64 362/236 |
| 2018/0012876 | A1 | 1/2018 | Kim et al. | |
| 2018/0019369 | A1* | 1/2018 | Cho | .................... H01L 25/0753 |
| 2018/0019377 | A1 | 1/2018 | Kim et al. | |
| 2018/0175104 | A1* | 6/2018 | Kang | ................... H01L 33/405 |
| 2019/0044024 | A1* | 2/2019 | Woo | ........................ H01L 33/08 |
| 2019/0096858 | A1* | 3/2019 | Woo | ........................ H01L 33/62 |
| 2019/0115513 | A1* | 4/2019 | Im | ....................... H01L 25/0753 |

OTHER PUBLICATIONS

"Angled Shadow Mask Deposition", www.stoner.leeds.ac.uk/Research/TutShadow, Mar. 30, 2018, 1 page.

"Microelectronics: Fabrication of micro/nano structures on silicon surface", www.diteepnanotech.com/articles/Lithoaraphy.html, Nanotech, Aug. 3, 2012, 4 pages.

\* cited by examiner

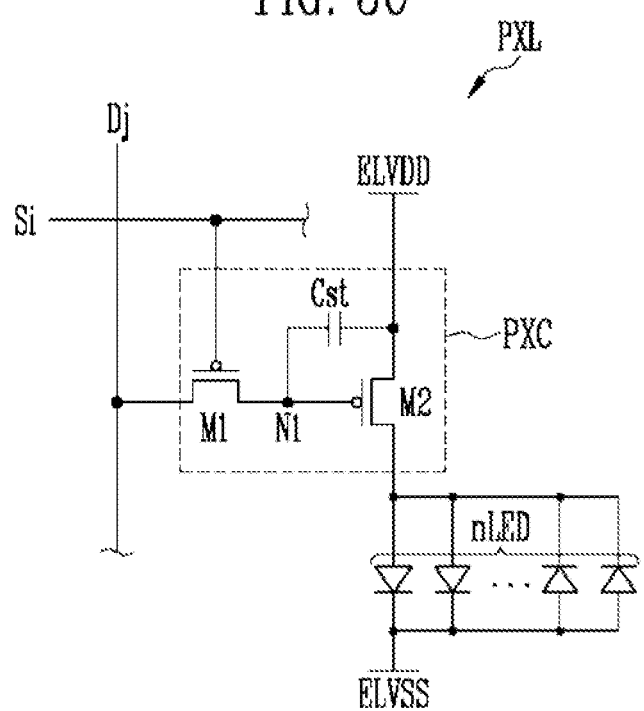

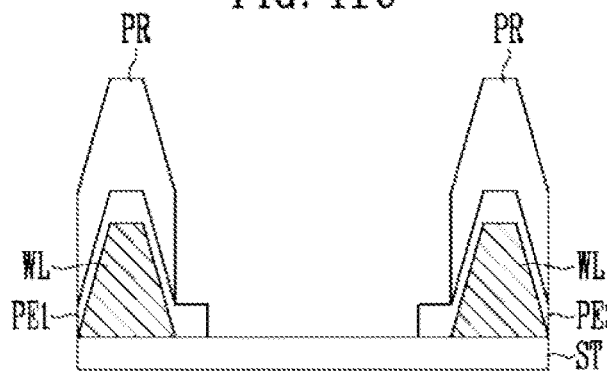
FIG. 11C
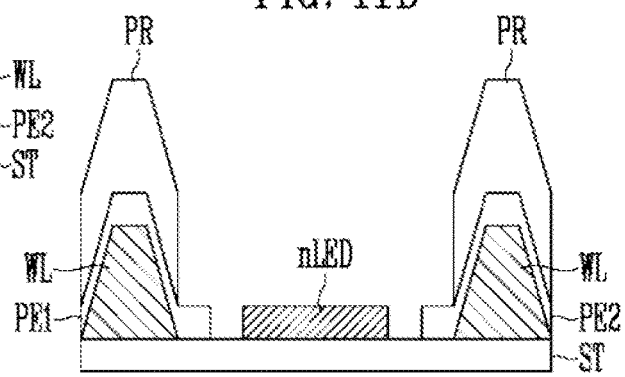
FIG. 11D
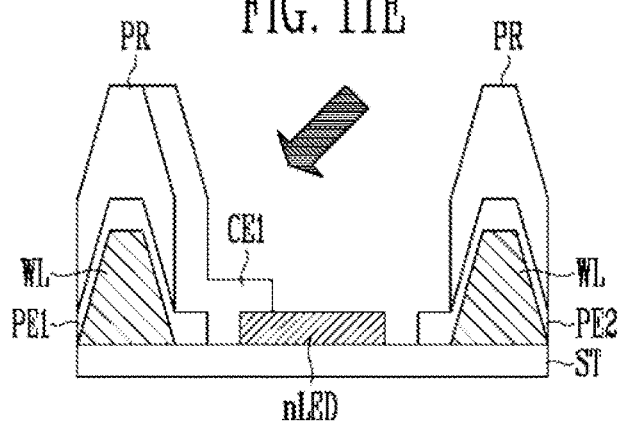
FIG. 11E
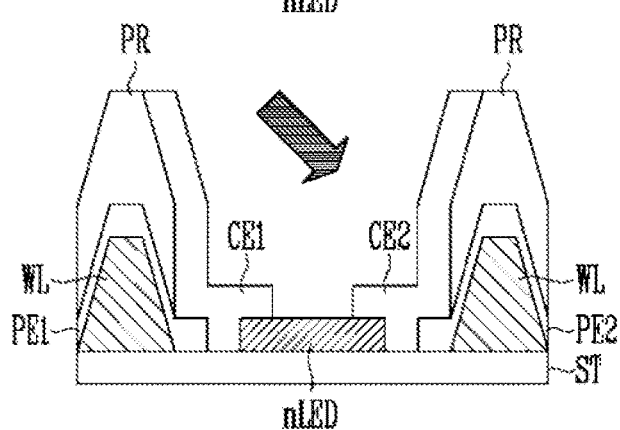

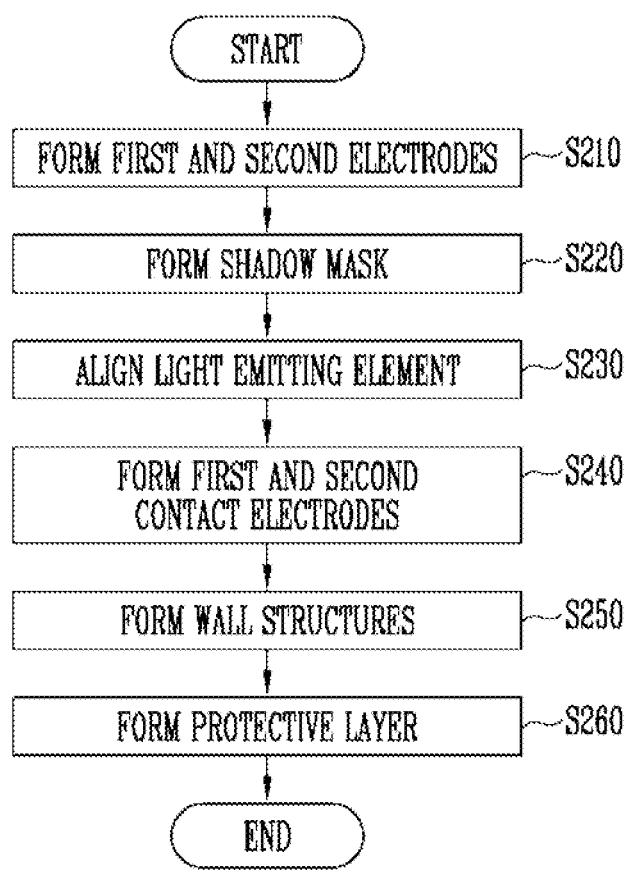

LIGHT EMITTING DEVICE AND METHOD OF FABRICATING THE SAME

CROSS-REFERENCE TO RELATED APPLICATION

This application claims priority to and the benefit of Korean Patent Application No. 10-2018-0078428, filed on Jul. 5, 2018 in the Korean Intellectual Property Office, the entire disclosure of which is incorporated herein by reference.

BACKGROUND

1. Field

Aspects of embodiments of the present disclosure relate to a light emitting device and a method of fabricating the same.

2. Description of Related Art

Light emitting diodes (herein, referred to as LEDs) exhibit relatively satisfactory durability, even in poor environmental conditions, and have excellent performance in terms of life span and luminance. Recently, studies for applying such LEDs to various light emitting devices have been actively conducted. As a part of such studies, there has been a technique for fabricating a micro bar type LED that is small to a degree of micro or nano scale using an inorganic crystal structure, e.g., a structure in which a nitride-based semiconductor is grown.

In an example, LEDs may be fabricated with a size small enough to constitute pixels of a self-luminescent display panel, etc. In order to fabricate a light emitting device using such bar type LEDs, there should be provided a plan for enabling bar type LEDs to be stably mounted such that the bar type LEDs are not separated from their aligned positions even when a subsequent process is performed after the bar type LEDs are aligned at desired positions.

SUMMARY

According to aspects of embodiments of the present disclosure, a light emitting device capable of enhancing image quality and improving a fabrication process, and a method of fabricating the light emitting device is provided.

According to one or more embodiments of the present disclosure, a light emitting device includes: a substrate including a light emitting region; a first electrode in the light emitting region; a second electrode in the light emitting region and spaced apart from the first electrode; a light emitting element between the first electrode and the second electrode; a first contact electrode connecting an end of the light emitting element to the first electrode; and a second contact electrode connecting another end of the light emitting element to the second electrode, wherein the first contact electrode and the second contact electrode have a thickness larger than or equal to that of the first electrode and the second electrode.

The light emitting device may further include wall structures respectively arranged between the substrate and the first and second electrodes.

The first electrode and the second electrode may entirely cover the wall structures.

The end of the light emitting element may be on the first electrode, and the another end of the light emitting element may be on the second electrode.

The light emitting device may further include wall structures respectively arranged on the first electrode and the second electrode.

The light emitting element may have a cylindrical shape or polygonal column shape having a micro or nano scale.

The first contact electrode and the second contact electrode may be transparent electrodes.

The light emitting device may further include a protective layer configured to protect the first electrode, the second electrode, the first contact electrode, the second contact electrode, and the light emitting element.

An end of the first electrode may be covered by the first contact electrode, an end of the second electrode may be covered by the second contact electrode, and the other ends of the first and second electrodes may be covered by the protective layer.

The end of the light emitting element may be covered by the first contact electrode, and the other end of the light emitting element may be covered by the second contact electrode.

According to one or more embodiments of the present disclosure, a method of fabricating a light emitting device includes: forming a first electrode and a second electrode in a light emitting region on a substrate to be spaced apart from each other; forming a shadow mask on the first electrode and the second electrode; aligning a light emitting element between the first electrode and the second electrode; forming a first contact electrode and a second contact electrode through shadow deposition using the shadow mask; and removing the shadow mask.

The method may further include, before the forming of the first electrode and the second electrode, forming wall structures on the substrate. The wall structures may be respectively arranged between the substrate and the first and second electrodes.

The first electrode and the second electrode may entirely cover the wall structures.

An end of the light emitting element may be on the first electrode, and another end of the light emitting element may be on the second electrode.

The method may further include forming a protective layer configured to protect the first electrode, the second electrode, the first contact electrode, the second contact electrode, and the light emitting element.

According to one or more embodiments of the present disclosure, a method of fabricating a light emitting device includes: forming a first electrode and a second electrode in a light emitting region on a substrate to be spaced apart from each other; forming a shadow mask on the first electrode and the second electrode; aligning a light emitting element between the first electrode and the second electrode; forming a first contact electrode and a second contact electrode through shadow deposition using the shadow mask; and forming wall structures on the first electrode and the second electrode.

An end of the light emitting element may be on the first electrode, and another end of the light emitting element may be on the second electrode.

The wall structures may be formed by thermally contracting the shadow mask.

The wall structures may be formed by dissolving the shadow mask.

The method may further include forming a protective layer configured to protect the wall structures, the first electrode, the second electrode, the first contact electrode, the second contact electrode, and the light emitting element.

According to aspects of the present disclosure, in a light emitting device and a method of fabricating the same, a pixel has a symmetric structure, such that an image having enhanced image quality can be displayed.

Further, in the light emitting device and the method of fabricating the same according to the present disclosure, the fabrication process can be improved.

BRIEF DESCRIPTION OF THE DRAWINGS

Some example embodiments will now be described more fully herein with reference to the accompanying drawings; however, the present disclosure may be embodied in different forms and should not be construed as limited to the embodiments set forth herein. Rather, these embodiments are provided such that this disclosure will be thorough and complete, and will fully convey the scope of the embodiments to those skilled in the art.

In the drawing figures, dimensions may be exaggerated for clarity of illustration. It is to be understood that when an element is referred to as being "between" two elements, it may be the only element between the two elements, or one or more intervening elements may also be present. Like reference numerals refer to like elements throughout.

FIGS. 3A to 3C are circuit diagrams illustrating a pixel according to embodiments of the present disclosure.

FIGS. 11A to 11E are views illustrating a method of fabricating a light emitting device according to an embodiment of the present disclosure.

FIG. 12 is a flowchart illustrating a method of fabricating a light emitting device according to an embodiment of the present disclosure.

DETAILED DESCRIPTION

Figure 1:
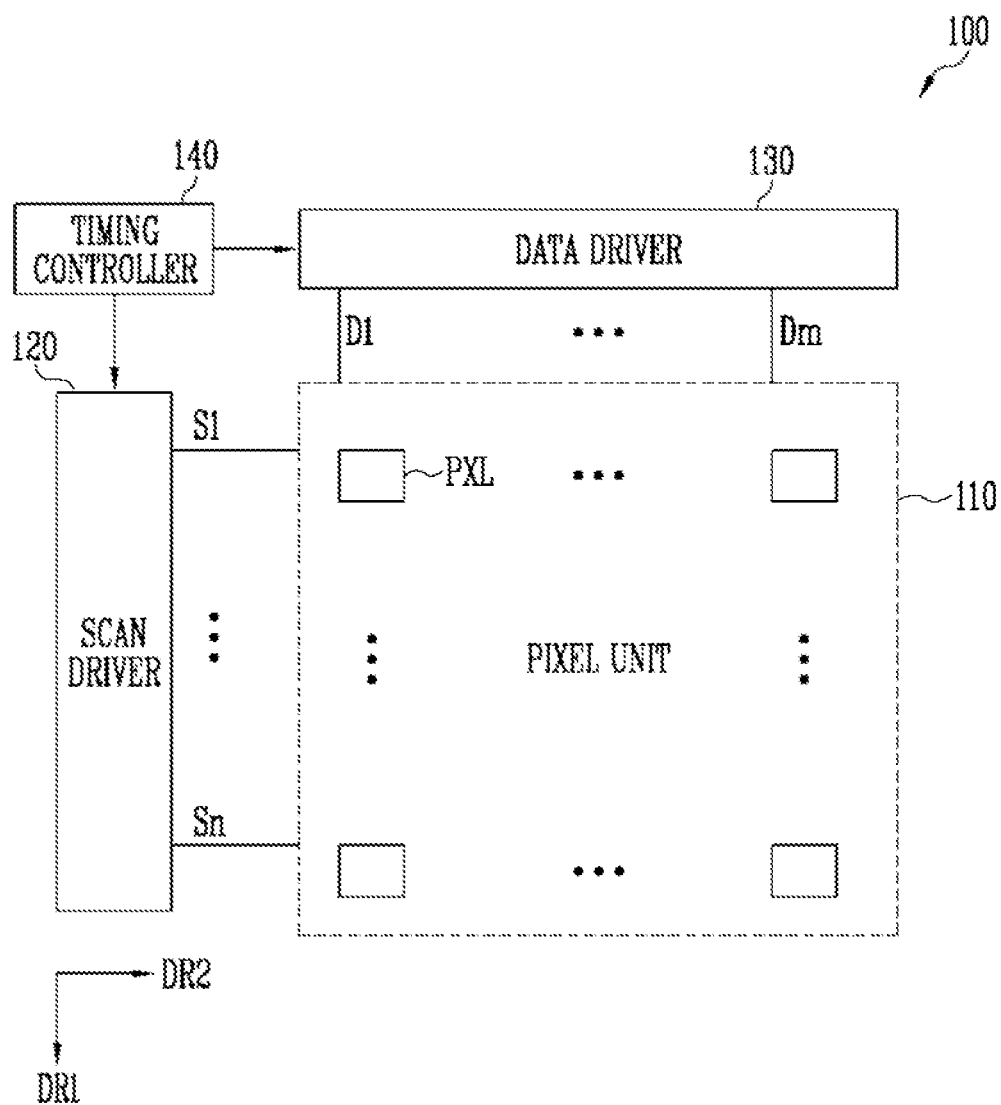
FIG. 1 is a schematic diagram illustrating a light emitting device according to an embodiment of the present disclosure.

In the following detailed description, certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

Like numbers refer to like elements throughout, and duplicative descriptions thereof may not be provided. The thicknesses, ratios, and dimensions of elements may be exaggerated in the drawings for clarity. As used herein, the term "and/or" includes any and all combinations of one or more of the associated listed items.

It is to be understood that, although the terms "first," "second," etc. may be used herein to describe one or more elements, these terms should not be construed as limiting such elements. These terms are used to distinguish one element from another element. Thus, a "first" element could be alternately termed a "second" element without departing from the spirit and scope of the present disclosure. Similarly, a "second" element could be alternately termed a "first" element. Singular forms of terms are intended to include the plural forms as well, unless the context clearly indicates otherwise.

Moreover, spatially relative terms, such as "beneath," "below," "lower," "above," "upper," and the like may be used herein for ease of description to describe one element's spatial relationship to another element(s) as illustrated in the drawings. It is to be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It is to be further understood that the terms "includes" and "including," when used in this disclosure, specify the presence of stated features, integers, steps, operations, elements, and/or components, but do not preclude the presence or addition of one or more other features, integers, steps, operations, elements, components, and/or groups thereof.

In the specification, when an element is referred to as being "connected" or "coupled" to another element, it may be directly connected or coupled to the another element or may be indirectly connected or coupled to the another element with one or more intervening elements interposed therebetween. Further, some of the elements that are not essential to the complete understanding of the disclosure may be omitted for clarity. Also, like reference numerals refer to like elements throughout.

FIG. 1 is a schematic diagram illustrating a light emitting device 100 according to an embodiment of the present disclosure. In some embodiments, although FIG. 1 illustrates a light emitting display device as an example of the light emitting device using a light emitting element, the light emitting device 100 according to the present disclosure is not limited thereto. In an example, the light emitting device 100 according to the present disclosure may be another type of light emitting device, such as a lighting device.

In some embodiments, the light emitting element may be a bar type light emitting diode (LED).

Referring to FIG. 1, the light emitting device 100 may include a pixel unit 110, a scan driver 120, a data driver 130, and a timing controller 140.

The pixel unit 110 may include a plurality of pixels PXL connected to scan lines S1 to Sn and data lines D1 to Dm.

The data lines D1 to Dm may extend along a first direction DR1, and the scan lines S1 to Sn may extend along a second direction DR2 different from the first direction DR1.

Figure 13:
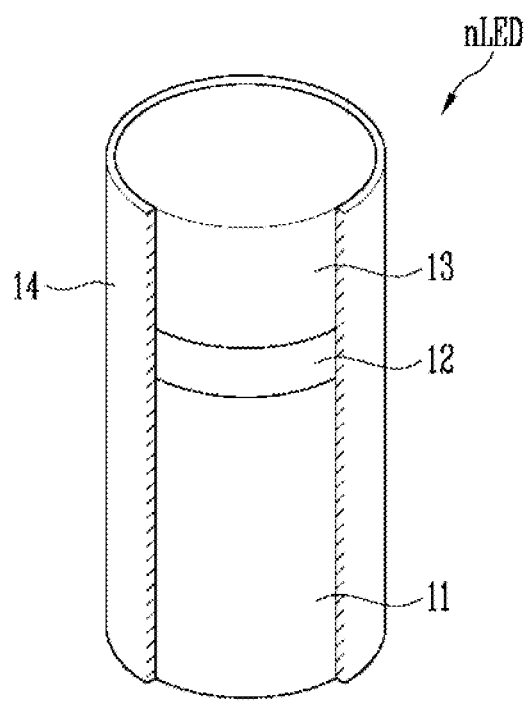
FIG. 13 is a view illustrating a light emitting element according to an embodiment of the present disclosure.

In an embodiment of the present disclosure, each of the pixels PXL may include at least one light emitting element nLED shown in FIG. 13.

For example, each of the pixels PXL may include at least one first color light emitting element, at least one second color light emitting element, and/or at least one third color light emitting element. The light emitting elements included in the pixel PXL may selectively emit light, corresponding to a data signal input from the data lines D1 to Dm when a scan signal is supplied to the scan lines S1 to Sn. In an example, each of the pixels PXL may emit light with a luminance corresponding to the input data signal during each frame period. In an embodiment, a pixel PXL supplied with a data signal corresponding to a black luminance does not emit light during a corresponding frame period, such that black can be displayed. In an embodiment, when the pixel unit 110 is an active type display panel, the pixel unit 110 may be driven by being further supplied with first and second pixel power sources in addition to the scan signal and the data signal.

The scan driver 120 may be supplied with a scan control signal from the timing controller 140, and generate scan signals, corresponding to the scan control signal. The scan signals generated by the scan driver 120 may be supplied to the pixels PXL through the scan lines S1 to Sn.

The data driver 130 may be supplied with a data control signal and image data from the timing controller 140, and generate data signals, corresponding to the data control signal and the image data. The data signals generated by the data driver 130 may be output to the data lines D1 to Dm. The data signals output to the data lines D1 to Dm may be input to pixels PXL on a horizontal pixel line selected by a corresponding scan signal.

The timing controller 140 may receive various control signals and image data, which are required to drive the pixel unit 110, from an external system (e.g., a system for transmitting image data). The timing controller 140 may realign the received image data and transmit the realigned image data to the data driver 130. Also, the timing controller 140 may generate scan control signals and data control signals, which are required to drive the scan driver 120 and the data driver 130, and transmit the generated scan control signals and the generated data control signals to the respective scan and data drivers 120 and 130.

Although FIG. 1 illustrates that the pixel unit 110 is a component separate from the timing controller 140, the scan driver 120, and/or the data driver 130, the present disclosure is not limited thereto. For example, at least one of the scan driver 120 and the data driver 130 may be integrated with the pixel unit 110 or be mounted on the pixel unit 110. For example, the pixel unit 110 may be a display panel.

Figure 2A:
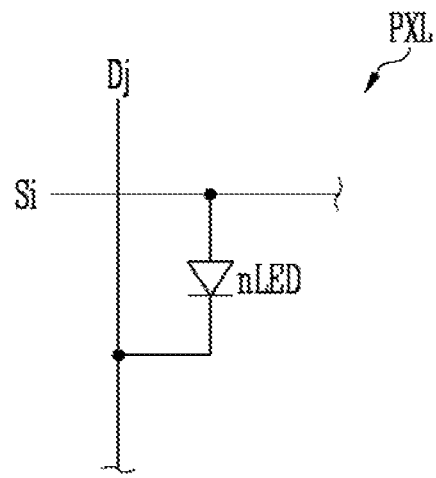
FIGS. 2A to 2C are circuit diagrams illustrating a pixel according to embodiments of the present disclosure.
Figure 2B:
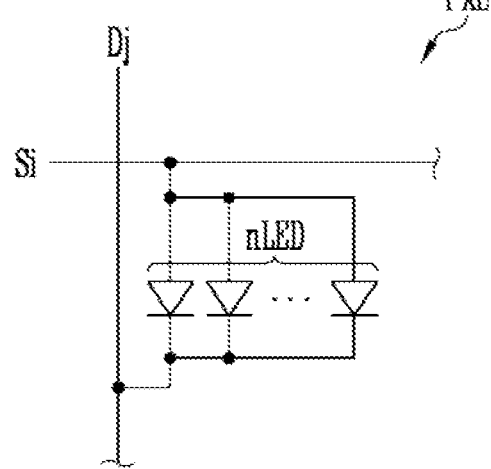
Figure 2C:
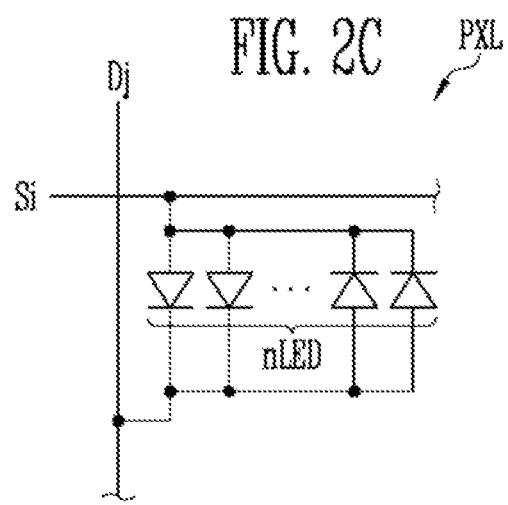

FIGS. 2A to 2C are circuit diagrams illustrating a pixel PXL according to embodiments of the present disclosure. In particular, FIGS. 2A to 2C disclose pixels having various structures applicable to a passive type light emitting display panel. For convenience, a jth (j is a natural number) pixel PXL on an ith (i is a natural number) horizontal pixel line is illustrated in FIGS. 2A to 2C.

In an embodiment, the pixel PXL may emit light of any one of red, green, and blue. However, the present disclosure is not limited thereto. In some embodiments, the pixel PXL may be a pixel that emits light of another color except red, green, and blue, e.g., light of white. The light emitting device 100 may be disposed to overlap with the pixel unit 110 of FIG. 1 or include a color filter layer integrally formed with the pixel unit 110.

Referring to FIG. 2A, the pixel PXL may include a light emitting element nLED (e.g., a bar type LED) that emits light of a color (e.g., a predetermined color). For example, the pixel PXL may include a light emitting element nLED capable of emitting light of any one of red, green, and blue.

In some embodiments, the pixel PXL may be connected to a scan line Si and a data line Dj. In an example, a first electrode (e.g., an anode electrode) of the pixel PXL may be connected to the scan line Si, and a second electrode (e.g., a cathode electrode) of the pixel PXL may be connected to the data line Dj. When a voltage equal to or larger than a threshold voltage is applied to both ends of the pixel PXL, the pixel PXL may emit light with a luminance corresponding to the magnitude of the applied voltage. That is, the emission of the pixel PXL may be controlled by adjusting the voltage of a scan signal applied to the scan line Si and/or the voltage of a data signal applied to the data line Dj.

However, the present disclosure is not limited thereto. In some embodiments, the connection direction of the light emitting element nLED may be variously set.

Referring to FIG. 2B, in some embodiments, the pixel PXL may include a plurality of light emitting elements nLED connected in parallel. The luminance of the pixel PXL may correspond to the sum of brightnesses of the plurality of light emitting elements nLED. When the pixel PXL includes the plurality of light emitting elements nLED, particularly, a large number of light emitting elements nLED, although a failure may occur in some light emitting elements nLED, the failure can be prevented or substantially prevented from resulting in a defect of the pixel PXL. In some embodiments, the connection direction of the light emitting elements nLED may be variously set.

Referring to FIG. 2C, in some embodiments, the pixel PXL may include a plurality of light emitting elements nLED connected in different directions.

In an example, the pixel PXL may include at least one light emitting element nLED having a first electrode (anode electrode) connected to the scan line Si and a second electrode (cathode electrode) connected to the data line Dj, and at least one light emitting element nLED having a first electrode (anode electrode) connected to the data line Dj and a second electrode (cathode electrode) connected to the scan line Si.

In some embodiments, the pixel PXL of FIG. 2C may be DC-driven or AC-driven.

When the pixel PXL of FIG. 2C is DC-driven, light emitting elements nLED connected in a forward direction may emit light, and light emitting elements nLED connected in a reverse direction may not emit light.

In an embodiment, when the pixel PXL of FIG. 2C is AC-driven, a plurality of light emitting elements nLED connected in the forward direction may emit light according to the direction of an applied voltage. That is, when the pixel PXL of FIG. 2C is AC-driven, the plurality of light emitting elements nLED included in the pixel PXL of FIG. 2C may alternately emit light according to the direction of the applied voltage.

Figure 3A:
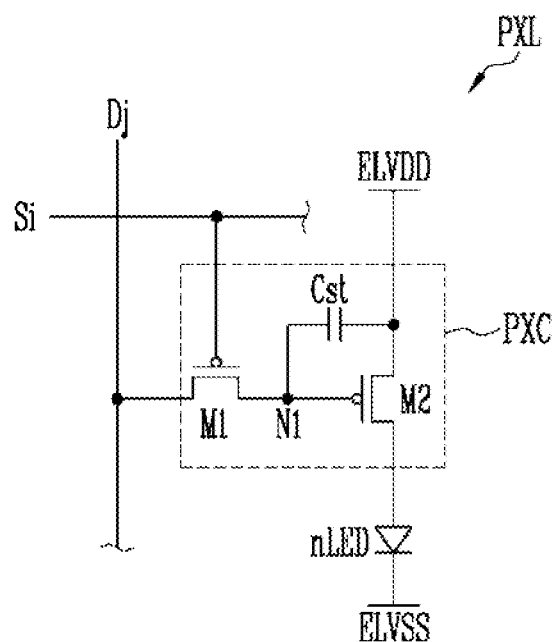
Figure 3B:
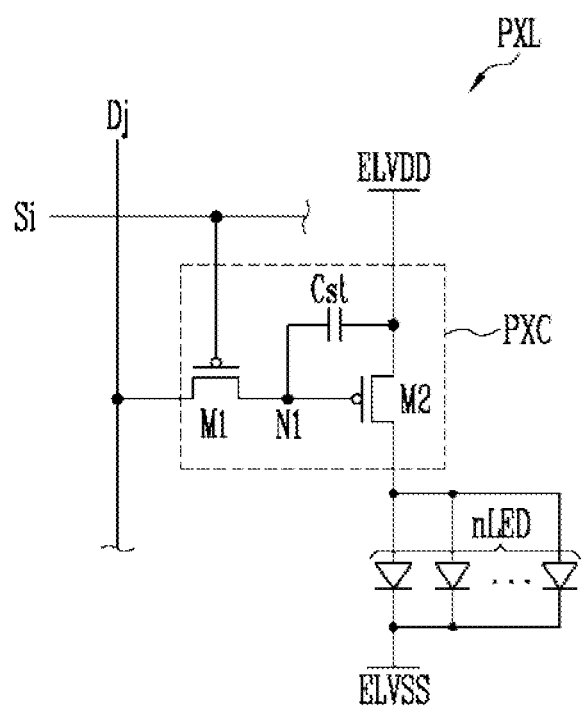

FIGS. 3A to 3C are circuit diagrams illustrating a pixel PXL according to embodiments of the present disclosure. In particular, FIGS. 3A to 3C disclose pixels having various structures applicable to an active type light emitting display panel. In FIGS. 3A to 3C, components similar or the same as those of FIGS. 2A to 2C are designated by like reference numerals, and their detailed descriptions will be omitted.

Referring to FIG. 3A, the pixel PXL may include a light emitting element nLED and a pixel circuit PXC connected thereto.

A first electrode (e.g., an anode electrode) of the light emitting element nLED may be connected to a first pixel power source ELVDD via the pixel circuit PXC, and a second electrode (e.g., a cathode electrode) of the light emitting element nLED may be connected to a second pixel power source ELVSS.

The first pixel power source ELVDD and the second pixel power source ELVSS may have different potentials. In an example, the second pixel power source ELVSS may have a potential lower by a threshold voltage of the light emitting element nLED than that of the first pixel power source ELVDD. The light emitting element nLED may emit light with a luminance corresponding to a driving current controlled by the corresponding pixel circuit PXC.

Although FIG. 3A illustrates an embodiment in which only one light emitting element nLED is included in the pixel PXL, the present disclosure is not limited thereto.

In some embodiments, as shown in FIGS. 3B and 3C, the pixel PXL may include a plurality of light emitting elements nLED connected in parallel.

In some embodiments, the pixel circuit PXC may include first and second transistors M1 and M2 and a storage capacitor Cst. However, the structure of the pixel circuit PXC is not limited to the embodiment shown in FIG. 3A.

A first electrode of the first transistor (switching transistor) M1 may be connected to a data line Dj, and a second electrode of the first transistor M1 may be connected to a first node N1. The first electrode and the second electrode of the first transistor M1 are different electrodes. For example, when the first electrode is a source electrode, the second electrode may be a drain electrode. In addition, a gate electrode of the first transistor M1 may be connected to a scan line Si. The first transistor M1 may be turned on when a scan signal having a voltage (e.g., a low voltage) at which the first transistor M1 can be turned on is supplied from the scan line Si, to connect the data line Dj and the first node N1. A data signal of a corresponding frame is supplied to the data line Dj. Accordingly, the data signal is transferred to the first node N1. The data signal transferred to the first node N1 is charged in the storage capacitor Cst.

A first electrode of the second transistor (driving transistor) M2 may be connected to the first pixel power source ELVDD, and a second electrode of the second transistor M2 may be connected to a first electrode of the light emitting element nLED. The second transistor M2 controls an amount of driving current supplied to the light emitting element nLED, corresponding to a voltage of the first node N1.

One electrode of the storage capacitor Cst may be connected to the first pixel power source ELVDD, and another electrode of the storage capacitor Cst may be connected to the first node N1. The storage capacitor Cst charges a voltage corresponding to the data signal supplied to the first node N1, and maintains the charged voltage until a data signal of a next frame is supplied.

For convenience, FIG. 3A illustrates the pixel PXL having a relatively simple structure including the first transistor M1 for transferring a data signal to the inside of the pixel PXL, the storage capacitor Cst for storing the data signal, and the second transistor M2 for supplying a driving current corresponding to the data signal to the light emitting element nLED. However, the present disclosure is not limited thereto, and the structure of the pixel circuit PXC may be variously modified and implemented.

In an example, it will be apparent that the pixel circuit PXC may further include at least one transistor element such as a transistor element for compensating for a threshold voltage of the second transistor M2, a transistor element for initializing the first node N1, and/or a transistor element for controlling emission time, or other circuit elements such as a boosting capacitor for boosting the voltage of the first node N1.

In addition, although FIGS. 3A to 3C illustrate that all the transistors, i.e., both the first and second transistors M1 and M2 included in the pixel circuit PXC are implemented with a P-type transistor, the present disclosure is not limited thereto. That is, at least one of the transistors M1 and M2 included in the pixel circuit PXC may be implemented with an N-type transistor.

Referring to FIG. 3B, in some embodiments, the pixel PXL may include a plurality of light emitting elements nLED connected in parallel. The luminance of the pixel PXL may correspond to the sum of brightnesses of the plurality of light emitting elements nLED. When the pixel PXL includes the plurality of light emitting elements nLED, particularly, a large number of light emitting elements nLED, although a failure may occur in some light emitting elements nLED, the failure can be prevented or substantially prevented from resulting in a defect of the pixel PXL. In some embodiments, the connection direction of the light emitting elements nLED may be variously set.

Referring to FIG. 3C, in some embodiments, the pixel PXL may include a plurality of light emitting elements nLED connected in different directions. The pixel PXL may be DC or AC-driven. This has been described with respect to FIG. 2C, and therefore, further detailed description will be omitted.

FIGS. 4A to 4D are plan views illustrating a pixel structure PXS of the light emitting device 100 according to embodiments of the present disclosure.

The pixel structure PXS represents a planar layout of a pixel PXL shown in FIGS. 2A to 2C. However, the present disclosure is not limited thereto. In a range in which those skilled in the art can apply, planar layouts of pixel structures PXS described below may be applied to the pixel PXL shown in FIGS. 3A to 3C.

For convenience, a case in which light emitting elements nLED are aligned in a horizontal direction is illustrated in FIGS. 4A to 4D, but the alignment direction of the light emitting element nLED is not limited thereto. For example, at least one light emitting element nLED may be arranged in a diagonal direction between first and second electrodes PE1 and PE2.

In addition, although a case in which the pixel structure PXS includes six light emitting elements nLED is illustrated in FIGS. 4A to 4D, the present disclosure is not limited thereto.

In some embodiments, the number of light emitting elements nLED included in each pixel structure PXS may be variously modified and implemented.

Figure 4A:
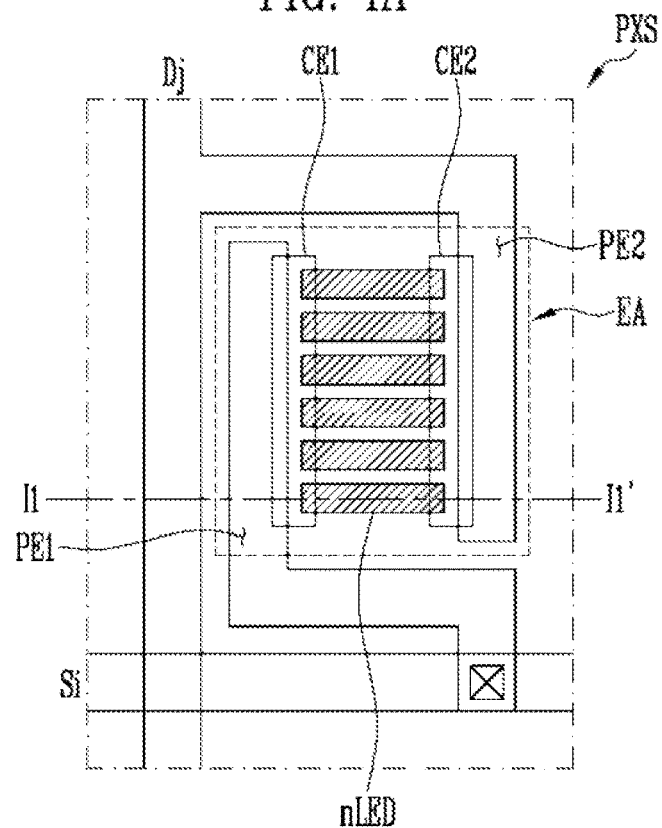
FIGS. 4A to 4D are plan views illustrating a pixel structure according to embodiments of the present disclosure.

Referring to FIG. 4A, the pixel structure PXS may include a first electrode PE1, a second electrode PE2, at least one light emitting element nLED disposed in a light emitting region EA, a first contact electrode CE1, and a second contact electrode CE2.

The light emitting device 100 according to an embodiment of the present disclosure may be a display device. The light emitting device 100 may include a light emitting display panel having the light emitting region EA corresponding to the pixel PXL.

The first electrode PE1 and the second electrode PE2 may be disposed to be spaced apart from each other. For example, the first electrode PE1 may be disposed in the light emitting region EA on a substrate. The second electrode PE2 may be disposed in the light emitting region EA to be spaced apart from the first electrode PE1.

The at least one light emitting element nLED may be disposed between the first electrode PE1 and the second electrode PE2.

In some embodiments, as shown in FIG. 4A, the at least one light emitting element nLED may be disposed on the same plane as the first electrode PE1 and the second electrode PE2 on the substrate. The at least one light emitting element nLED may be disposed to be spaced apart from the first electrode PE1 and the second electrode PE2.

The first electrode PE1 and the second electrode PE2 may be implemented with a transparent electrode.

The first contact electrode CE1 may connect one end of the at least one light emitting element nLED to the first electrode PE1. A portion of a front surface (upper surface) of the first electrode PE1 may be covered by the first contact electrode CE1.

The second contact electrode CE2 may connect the other end of the at least one light emitting element nLED to the second electrode PE2. A portion of a front surface (upper surface) of the second electrode PE2 may be covered by the second contact electrode CE2.

In some embodiments, the first contact electrode CE1 and the second contact electrode CE2 may include a transparent electrode. For example, the first contact electrode CE1 and the second contact electrode CE2 may include at least one of indium tin oxide (ITO) and indium gallium oxide (IGO) as the transparent electrode. In an embodiment, the light emitting device 100 may be implemented with a bottom-emission light emitting display device.

In some embodiments, the first contact electrode CE1 and the second contact electrode CE2 may include an opaque electrode. For example, the first contact electrode CE1 and the second contact electrode CE2 may include at least one of aluminum, titanium, chromium, indium, gold, and silver. The light emitting device 100 may be implemented with a top-emission or bottom-emission light emitting display device.

For example, the first contact electrode CE1 and the second contact electrode CE2 may electrically or physically connect the at least one light emitting element nLED and the first and second electrodes PE1 and PE2. The first contact electrode CE1 and the second contact electrode CE2 can improve connection stability between the light emitting element nLED and the electrodes PE1 and PE2.

In some embodiments, the first contact electrode CE1 and the second contact electrode CE2 may have different work functions. Accordingly, contact resistance caused by the first contact electrode CE1 and the second contact electrode CE2 can be minimized or reduced.

Each of the first contact electrode CE1 and the second contact electrode CE2 may be any one of an n-type contact electrode and a p-type contact electrode. The n-type contact electrode refers to an electrode having a relatively low work function, and the p-type contact electrode refers to an electrode having a relatively high work function. For example, the n-type contact electrode may include any of aluminum, titanium, chromium, and the like, and the p-type contact electrode may include any of nickel, ITO, and the like. A driving current may flow from the n-type contact electrode to the p-type contact electrode via the light emitting element nLED.

In some embodiments, when the first contact electrode CE1 is the n-type contact electrode, the second contact electrode CE2 may be the p-type contact electrode. In an embodiment, when the second contact electrode CE2 is the n-type contact electrode, the first contact electrode CE1 may be the p-type contact electrode.

The first electrode PE1 may be connected to a first electrode line, and the second electrode PE2 may be connected to a second electrode line to be supplied with a power or signal (e.g., a predetermined power or signal).

In some embodiments, the first electrode PE1 of the passive type light emitting display panel shown in FIGS. 2A to 2C may be connected to the scan line Si to be supplied with a scan signal, and the second electrode PE2 of the passive type light emitting display panel may be connected to the data line Dj to be supplied with a data signal.

In some embodiments, in the active type light emitting display panel shown in FIGS. 3A to 3C, at least one of the first electrode PE1 and the second electrode PE2 may be connected to the pixel circuit PXC.

In an embodiment, the first and second electrodes PE1 and PE2 may be electrically connected respectively to first and second shorting bars (not shown) in a process of aligning the at least one light emitting element nLED during a fabrication process of the light emitting device 100.

The first shorting bar may be commonly connected to the one end (first electrode) of the at least one light emitting element nLED, and the second shorting bar may be commonly connected to the other end (second electrode) of the at least one light emitting element nLED.

However, when the at least one light emitting element nLED is to be independently driven after the light emitting device 100 is fabricated, the connection between the first and second electrodes PE1 and PE2 of the at least one light emitting element nLED and the first and second shorting bars may be cut off. In an example, the first and second shorting bars may be formed at the outside of a scribing line of the light emitting display panel, such that the first and second electrodes PE1 and PE2 can be separated from the first and second shorting bars at the same time when a scribing process is performed.

Figure 4B:
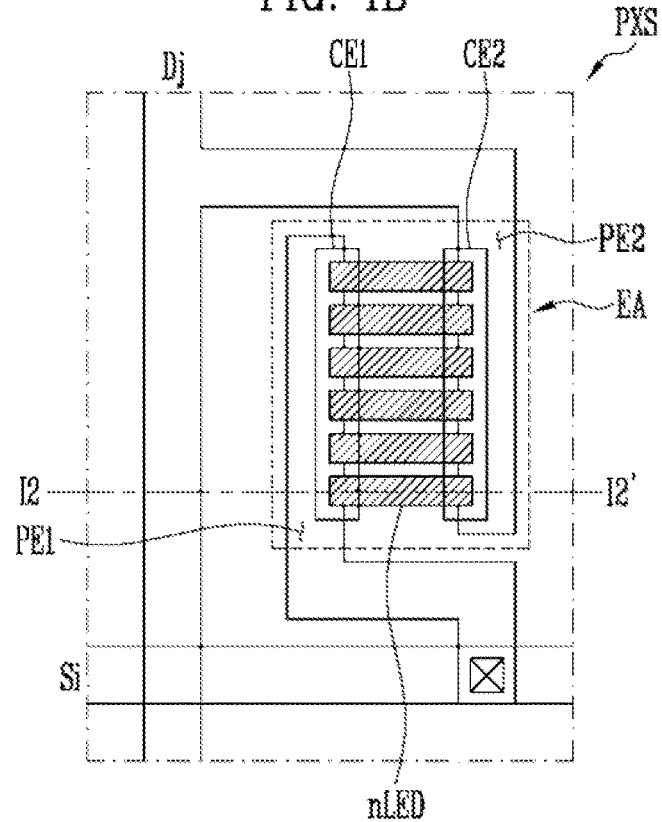

Referring to FIG. 4B, the pixel structure PXS may include a first electrode PE1, a second electrode PE2, at least one light emitting element nLED disposed in a light emitting region EA, a first contact electrode CE1, and a second contact electrode CE2.

In order to avoid redundancy, features the same or similar to those described in FIG. 4A will be omitted from the following description of FIG. 4B.

In some embodiments, as shown in FIG. 4B, the at least one light emitting element nLED may be disposed on a plane different from that of the first electrode PE1 and the second electrode PE2. One end of the at least one light emitting element nLED may be disposed on the first electrode PE1, and the other end of the at least one light emitting element nLED may be disposed on the second electrode PE2.

Figure 4C:
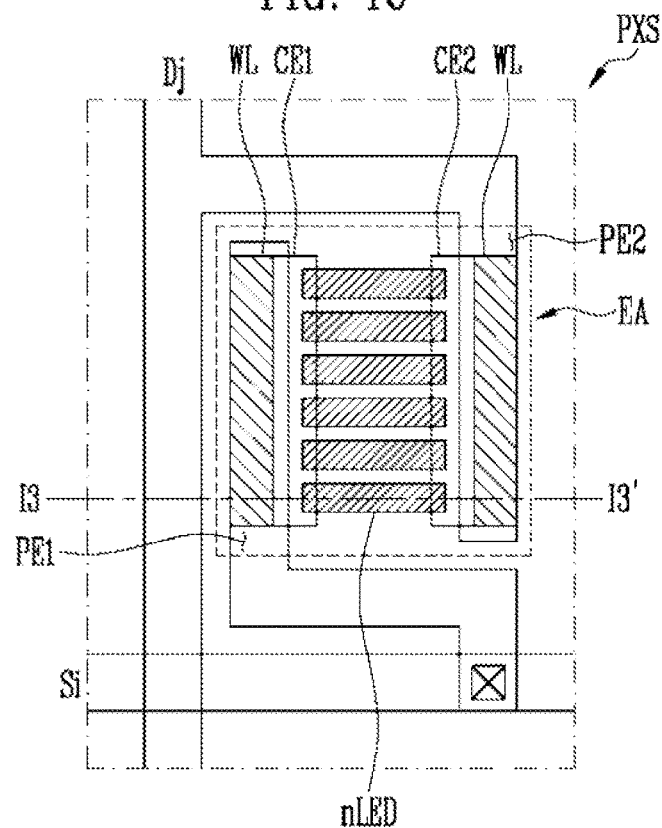

Referring to FIG. 4C, the pixel structure PXS may include wall structures WL, a first electrode PE1, a second electrode PE2, at least one light emitting element nLED disposed in a light emitting region EA, a first contact electrode CE1, and a second contact electrode CE2.

In order to avoid redundancy, contents overlapping with those of FIG. 4A will be omitted from the following description of FIG. 4C.

In some embodiments, as shown in FIG. 4C, the wall structures WL may be disposed on the first electrode PE1 and the second electrode PE2, respectively.

Figure 4D:
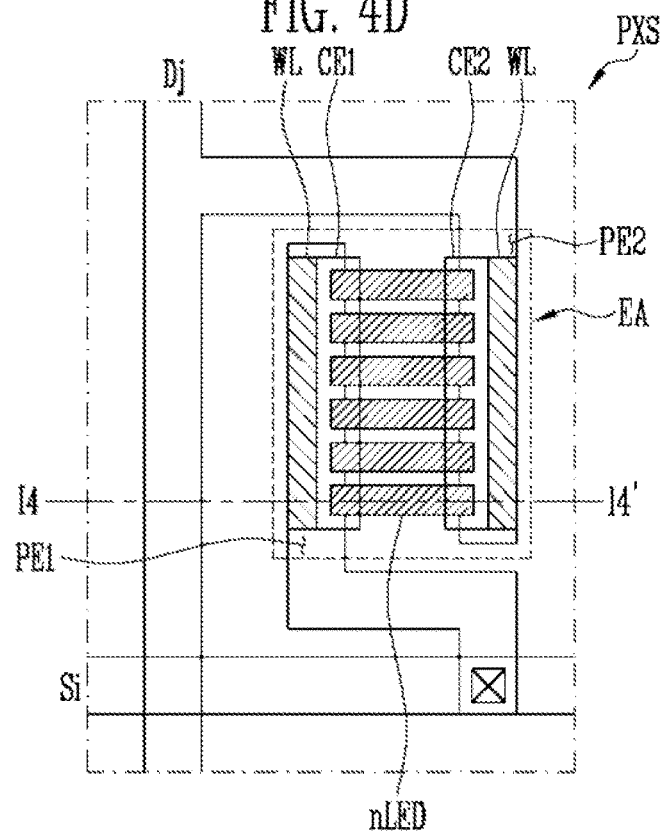

Referring to FIG. 4D, the pixel structure PXS may include wall structures WL, a first electrode PE1, a second electrode PE2, at least one light emitting element nLED disposed in a light emitting region EA, a first contact electrode CE1, and a second contact electrode CE2.

In order to avoid redundancy, contents overlapping with those of FIG. 4C will be omitted from the following description of FIG. 4D.

In some embodiments, as shown in FIG. 4D, the at least one light emitting element nLED may be disposed on a plane different from that of the first electrode PE1 and the second electrode PE2. One end of the at least one light emitting element nLED may be located on the first electrode PE1, and the other end of the at least one light emitting element nLED may be located on the second electrode PE2.

Figure 5A:
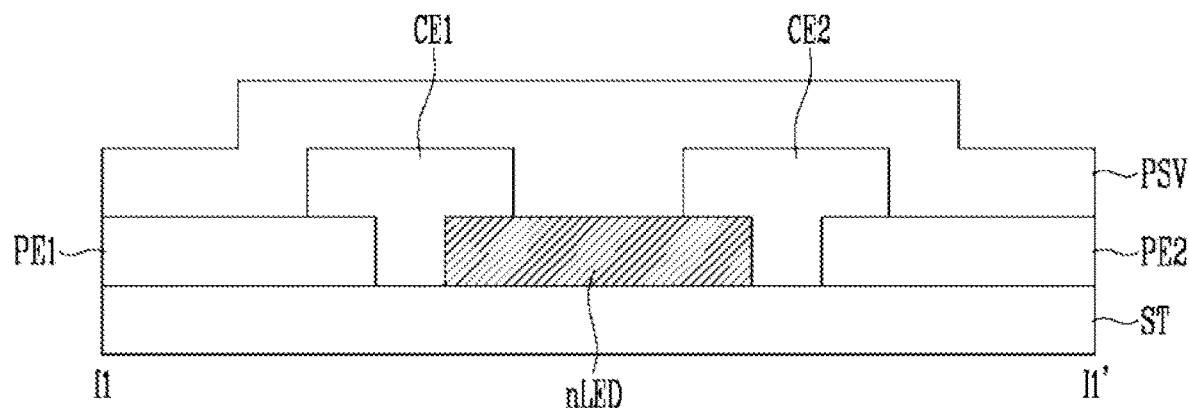
FIGS. 5A and 5B are views illustrating a cross-section taken along the line 11-11' of the pixel structure shown in FIG. 4A.
Figure 5B:
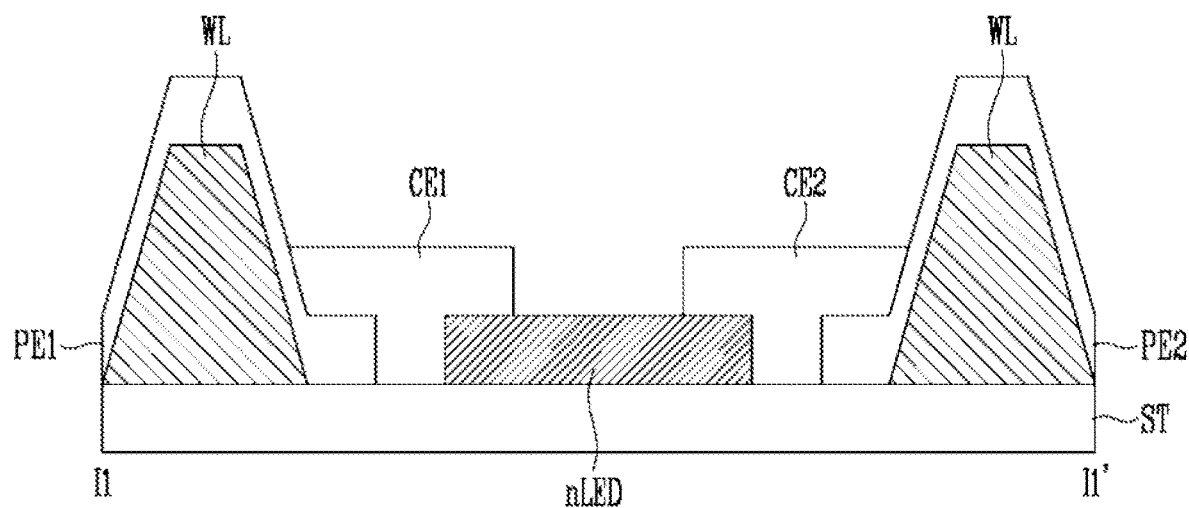

FIGS. 5A and 5B are views illustrating a cross-section taken along the line I1-I1' of the pixel structure PXS shown in FIG. 4A.

Referring to FIG. 5A, a light emitting device 100 according to an embodiment of the present disclosure may include a substrate ST, a first electrode PE1, a second electrode PE2, a light emitting element nLED, a first contact electrode CE1, a second contact electrode CE2, and a protective layer PSV.

The substrate ST may be, for example, an insulating substrate made of a transparent material. For example, the substrate ST may be a flexible substrate including at least one of polyether sulfone (PES), polyacrylate (PA), polyetherimide (PEI), polyethylene naphthalate (PEN), polyethylene terephthalate (PET), polyphenylene sulfide (PPS), polyarylate (PAR), polyimide (PI), polycarbonate (PC), triacetate cellulose (TAC), and cellulose acetate propionate (CAP). In an embodiment, the substrate ST may be a rigid substrate including one of glass and tempered glass. In an embodiment, the substrate ST is not necessarily limited to a transparent substrate. In an example, the substrate ST may be an opaque and/or reflective substrate.

In some embodiments, the light emitting device 100 may further include a buffer layer (not shown) disposed on the substrate ST.

The first electrode PE1 and the second electrode PE2 may be disposed on the substrate ST to be spaced apart from each other.

In some embodiments, as shown in FIGS. 5A and 5B, the first and second electrodes PE1 and PE2 may be spaced apart from each other at a distance longer than the length of the light emitting element nLED.

For example, the first and second electrodes PE1 and PE2 may be spaced apart from each other at a predetermined distance.

The first and second electrodes PE1 and PE2 may be formed of at least one of various conductive electrode materials.

In some embodiments, the first and second electrodes PE1 and PE2 may be disposed on the same plane on the substrate ST, and may have the same thickness.

As shown in FIG. 5A, one end of the first electrode PE1 may be covered by the first contact electrode CE1, one end of the second electrode PE2 may be covered by the second contact electrode CE2, and the other ends of the first and second electrodes PE1 and PE2 may be covered by the protective layer PSV.

The light emitting element nLED may be disposed between the first electrode PE1 and the second electrode PE2. For example, the light emitting element nLED may be disposed between the first electrode PE1 and the second electrode PE2 to be spaced apart from the first electrode PE1 and the second electrode PE2 at a distance (e.g., a predetermined distance).

In some embodiments, the light emitting element nLED may be disposed directly on the substrate ST. In an embodiment, the first electrode PE1 and the second electrode PE2 may have the same thickness as the light emitting element nLED.

The light emitting element nLED will be described in further detail with reference to FIG. 13.

The first contact electrode CE1 and the second contact electrode CE2 may be disposed on the light emitting element nLED, the first electrode PE1, and the second electrode PE2.

The first contact electrode CE1 may connect one end of the light emitting element nLED to the first electrode PE1.

The second contact electrode CE2 may connect the other end of the light emitting element nLED to the second electrode PE2.

In some embodiments, the first contact electrode CE1 and the second contact electrode CE2 may be disposed on the same plane, and may have the same thickness.

In an embodiment, the first contact electrode CE1 and the second contact electrode CE2 may have a thickness larger than or equal to that of the first electrode PE1 and the second electrode PE2.

For example, the first contact electrode CE1 may cover the one end of the light emitting element nLED and the one end of the first electrode PE1. The second contact electrode CE2 may cover the other end of the light emitting element nLED and the one end of the second electrode PE2. Therefore, both sides of the light emitting element nLED may be electrically connected to the first and second electrodes PE1 and PE2 through the first and second contact electrodes CE1 and CE2, respectively.

In some embodiments, the first contact electrode CE1 and the second contact electrode CE2 may be made of a transparent conductive material, such as ITO, IZO or ITZO, such that light emitted from the light emitting element nLED can be transmitted therethrough. However, the present disclosure is not limited thereto, and the material constituting the first contact electrode CE1 and the second contact electrode CE2 may be variously modified.

The protective layer PSV may be a layer for protecting at least one of the first electrode PE1, the second electrode PE2, the light emitting element nLED, the first contact electrode CE1, and the second contact electrode CE2 from an external physical or chemical impact.

The protective layer PSV may be disposed over the first electrode PE1, the second electrode PE2, the light emitting element nLED, the first contact electrode CE1, and the second contact electrode CE2.

Although the protective layer PSV is not separately described or illustrated in other portions of this specification, the protective layer PSV disposed in the uppermost layer to protect elements as shown in FIG. 5A may be applied to other embodiments of the present disclosure.

Referring to FIG. 5B, a light emitting device 100 according to an embodiment of the present disclosure may include a substrate ST, wall structures WL, a first electrode PE1, a second electrode PE2, a light emitting element nLED, a first contact electrode CE1, and a second contact electrode CE2.

In order to avoid redundancy, features the same or similar to those described in FIG. 5A will be omitted from the following description of FIG. 5B.

The light emitting device 100 shown in FIG. 5B may further include the wall structures WL, as compared with the light emitting device 100 shown in FIG. 5A.

The wall structures WL may be disposed on the substrate ST to be spaced apart from each other.

For example, the wall structures WL may be disposed between the substrate ST and the first electrode PE1, and between the substrate ST and the second electrode PE2.

The first electrode PE1 and the second electrode PE2 may be disposed on the wall structures WL and the substrate ST to be spaced apart from each other.

In some embodiments, the first electrode PE1 and the second electrode PE2 may entirely cover the wall structures WL.

Figure 6A:
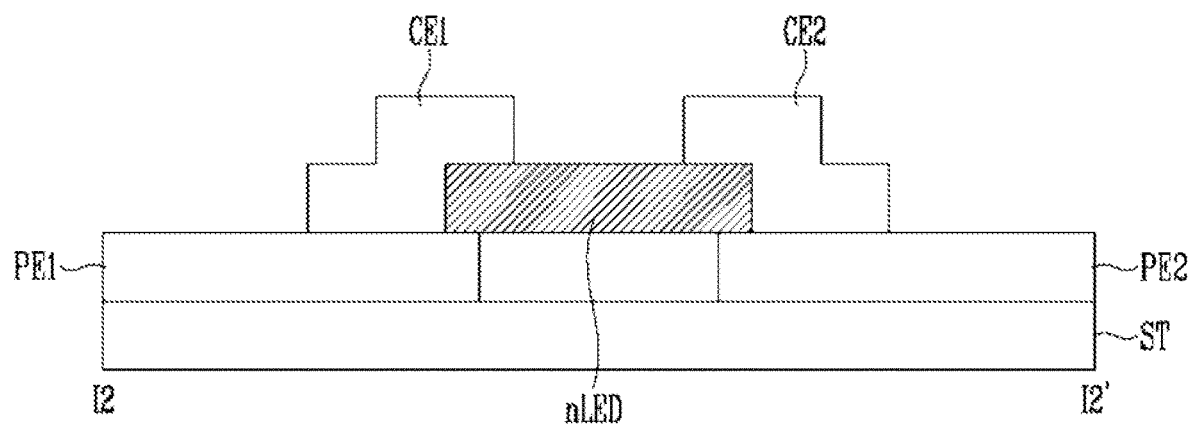
FIGS. 6A and 6B are views illustrating a cross-section taken along the line 12-12' of the pixel structure shown in FIG. 4B.
Figure 6B:
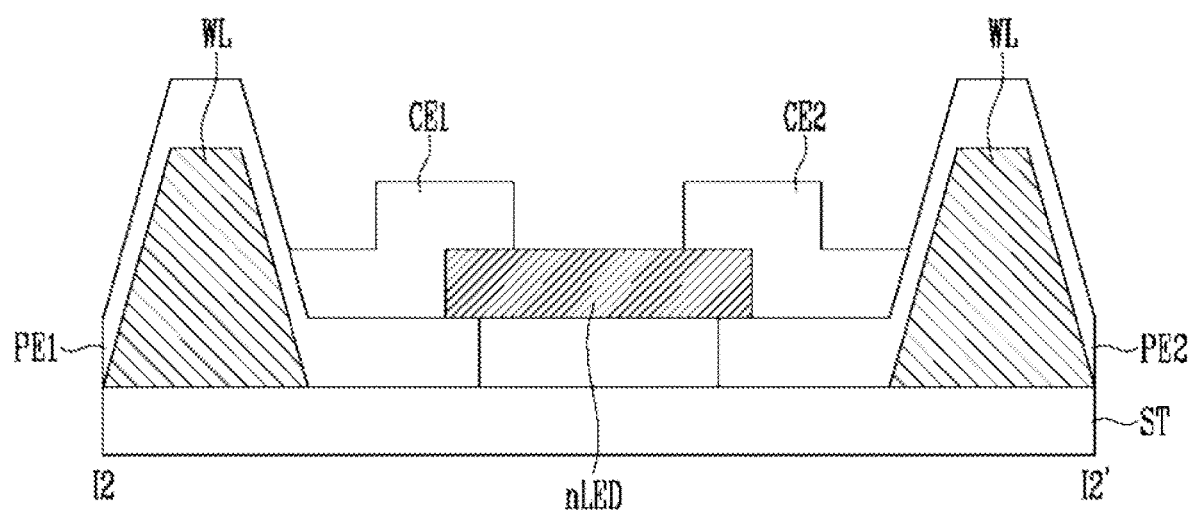

FIGS. 6A and 6B are views illustrating a cross-section taken along the line I2-I2' of the pixel structure PXS shown in FIG. 4B.

In order to avoid redundancy, features the same or similar to those described in FIG. 5A will be omitted from the following description of FIG. 6A.

A position of a light emitting element nLED shown in FIG. 6A is different from that in the embodiment illustrated in FIG. 5A.

Referring to FIG. 6A, a light emitting device 100 according to an embodiment of the present disclosure may include a substrate ST, a first electrode PE1, a second electrode PE2, a light emitting element nLED, a first contact electrode CE1, and a second contact electrode CE2.

The first electrode PE1 and the second electrode PE2 may be disposed on the substrate ST to be spaced apart from each other.

In some embodiments, as shown in FIGS. 6A and 6B, the first and second electrodes PE1 and PE2 may be spaced apart from each other at a distance shorter than the length of the light emitting element nLED.

For example, the first and second electrodes PE1 and PE2 may be spaced apart from each other at a distance to a degree in which both ends of the light emitting element nLED can be connected between the first and second electrodes PE1 and PE2 while being stably located on the first and second electrodes PE1 and PE2.

In some embodiments, the first and second electrodes PE1 and PE2 may be disposed on the same plane on the substrate ST, and may have the same thickness. When the first and second electrodes PE1 and PE2 have the same thickness, the light emitting element nLED can be more stably located on the first and second electrodes PE1 and PE2.

In an embodiment, the first and second electrodes PE1 and PE2 may overlap with the light emitting element nLED on a plane as shown in FIG. 4B.

The light emitting element nLED may be disposed between the first electrode PE1 and the second electrode PE2. For example, one end of the light emitting element nLED may be disposed on the first electrode PE1, and the other end of the light emitting element nLED may be disposed on the second electrode PE2.

In some embodiments, the light emitting element nLED may include an insulating film 14 (see FIG. 13) formed on an outer circumferential surface thereof. The insulating film 14 may prevent or substantially prevent an active layer of the light emitting element nLED from being short circuited with the first electrode PE1 and the second electrode PE2. However, when the insulating film 14 is located between the light emitting element nLED and the first and second electrodes PE1 and PE2, electrical connection between the light emitting element nLED and the first and second electrodes PE1 and PE2 may be interrupted.

Therefore, in some embodiments, the light emitting element nLED may be stably connected to the first electrode PE1 and the second electrode PE2 by removing at least a portion of the insulating film 14 or by additionally forming the first contact electrode CE1 and the second contact electrode CE2. The first contact electrode CE1 and the second contact electrode CE2 may provide a function of physically connecting the light emitting element nLED and the first and second electrodes PE1 and PE2.

In some embodiments, in order to stably fix the light emitting element nLED, a separate adhesive insulator, a fastener, or the like may be provided between the light emitting element nLED and the substrate ST.

Referring to FIG. 6B, a light emitting device 100 according to an embodiment of the present disclosure may include a substrate ST, wall structures WL, a first electrode PE1, a second electrode PE2, a light emitting element nLED, a first contact electrode CE1, and a second contact electrode CE2.

In order to avoid redundancy, features the same or similar to those described in FIG. 6A will be omitted from the following description of FIG. 6B.

The light emitting device 100 shown in FIG. 6B may further include the wall structures WL, as compared with the light emitting device 100 shown in FIG. 6A. A position of the light emitting element nLED shown in FIG. 6B is different from that in the embodiment illustrated in FIG. 5B.

The wall structures WL may be disposed on the substrate ST to be spaced apart from each other.

For example, the wall structures WL may be disposed between the substrate ST and the first electrode PE1, and between the substrate ST and the second electrode PE2.

The first electrode PE1 and the second electrode PE2 may be disposed on the wall structures WL and the substrate ST to be spaced apart from each other.

In some embodiments, the first electrode PE1 and the second electrode PE2 may entirely cover the wall structures WL.

Figure 7:
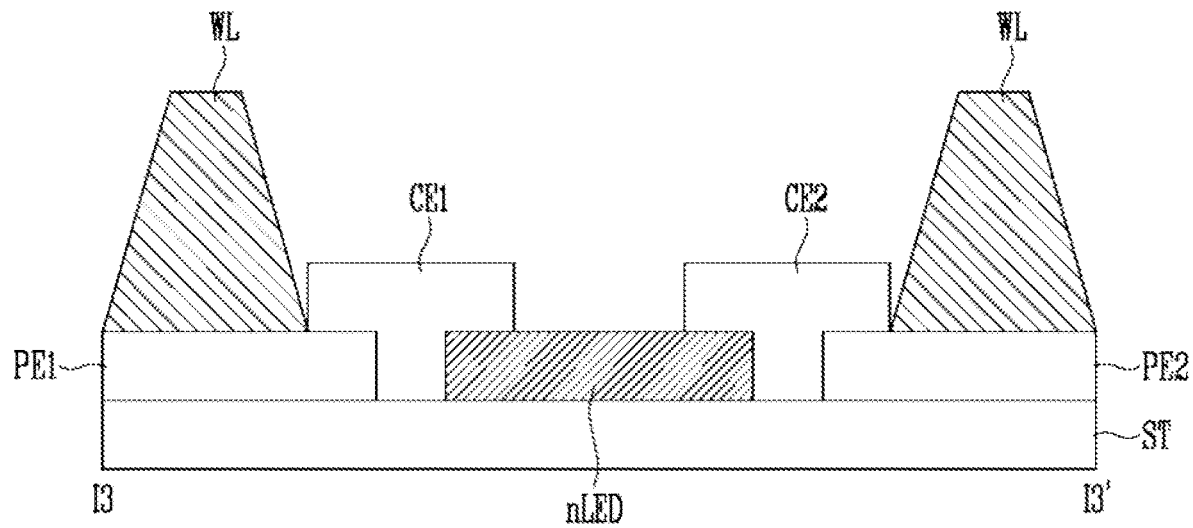
FIG. 7 is a view illustrating a cross-section taken along the line 13-13' of the pixel structure shown in FIG. 4C.

FIG. 7 is a view illustrating a cross-section taken along the line I3-I3' of the pixel structure PXS shown in FIG. 4C.

Referring to FIG. 7, a light emitting device 100 according to an embodiment of the present disclosure may include wall structures WL, a substrate ST, a first electrode PE1, a second electrode PE2, a light emitting element nLED, a first contact electrode CE1, a second contact electrode CE2, and a protective layer PSV (not shown).

In order to avoid redundancy, features the same or similar to those described in FIG. 5A will be omitted from the following description of FIG. 7.

The light emitting device 100 shown in FIG. 7 may further include the wall structures WL, as compared with the light emitting device 100 shown in FIG. 5A. Positions of the wall structures WL shown in FIG. 7 are different from those in the embodiment illustrated in FIG. 5B.

The wall structures WL may be respectively disposed on the first electrode PE1 and the second electrode PE2 to be spaced apart from each other.

For example, the wall structures WL may be disposed on a portion of the first electrode PE1, which is not covered by the first contact electrode CE1, and disposed on a portion of the second electrode PE2, which is not covered by the second contact electrode CE2.

Figure 8:
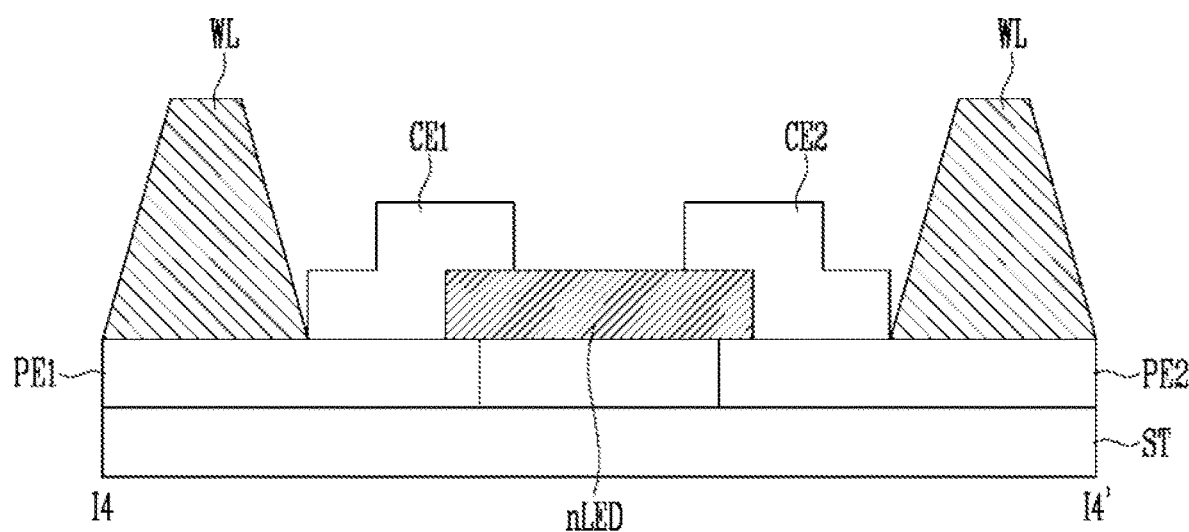
FIG. 8 is a view illustrating a cross-section taken along the line 14-14' of the pixel structure shown in FIG. 4D.

FIG. 8 is a view illustrating a cross-section taken along the line I4-I4' of the pixel structure PXS shown in FIG. 4D.

Referring to FIG. 8, a light emitting device 100 according to an embodiment of the present disclosure may include wall structures WL, a substrate ST, a first electrode PE1, a second electrode PE2, a light emitting element nLED, a first contact electrode CE1, a second contact electrode CE2, and a protective layer PSV (not shown).

In order to avoid redundancy, features the same or similar to those described in FIG. 6A will be omitted from the following description of FIG. 8.

The light emitting device 100 shown in FIG. 8 may further include the wall structures WL, as compared with the light emitting device 100 shown in FIG. 6A. Positions of the wall structures WL shown in FIG. 8 are different from those in the embodiment illustrated in FIG. 6B.

The wall structures WL may be disposed on the first electrode PE1 and the second electrode PE2 to be spaced apart from each other.

For example, the wall structures WL may be disposed on a portion of the first electrode PE1, which is not covered by the first contact electrode CE1, and disposed on a portion of the second electrode PE2, which is not covered by the second contact electrode CE2.

Figure 9A:
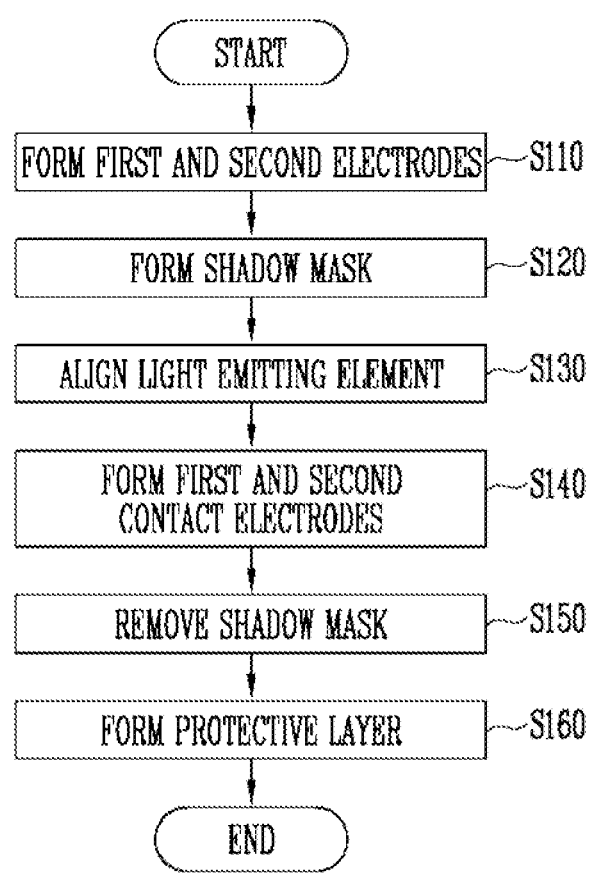
FIGS. 9A and 9B are flowcharts illustrating a method of fabricating a light emitting device according to embodiments of the present disclosure.
Figure 9B:
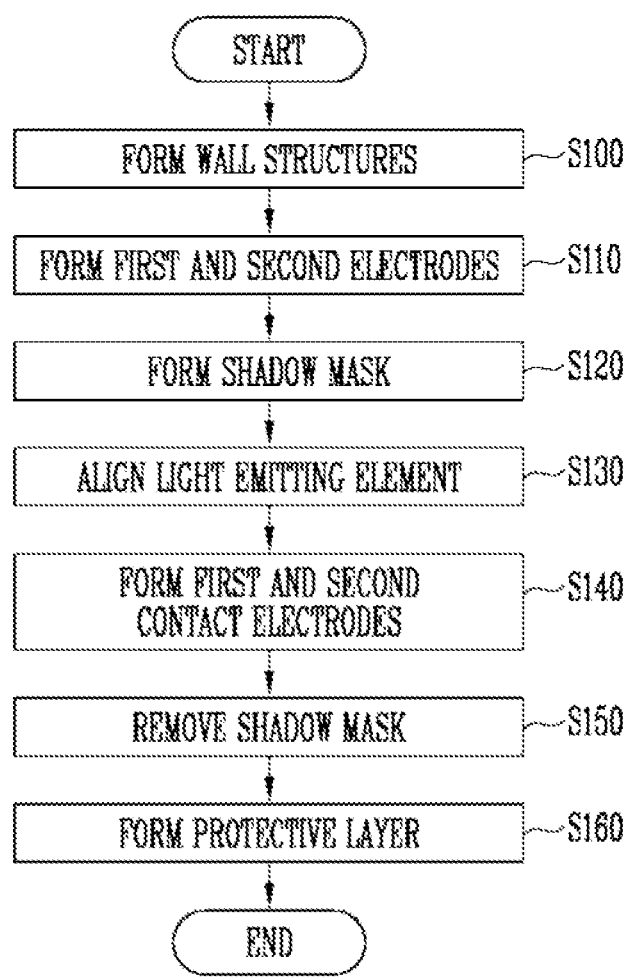

FIGS. 9A and 9B are flowcharts illustrating a method of fabricating a light emitting device according to embodiments of the present disclosure. FIGS. 10A to 10D are views illustrating a method of fabricating a light emitting device according to an embodiment of the present disclosure. FIGS. 11A to 11E are views illustrating a method of fabricating a light emitting device according to an embodiment of the present disclosure.

Herein, a method of fabricating a light emitting device according to an embodiment of the present disclosure, which is illustrated in FIG. 9A, will be described in further detail with reference to FIGS. 4A, 4B, 5A, 6A, 9A, and 10A to 10D.

Figure 10A:
FIGS. 10A to 10D are views illustrating a method of fabricating a light emitting device according to an embodiment of the present disclosure.

A first electrode PE1 and a second electrode PE2 may be formed in a light emitting region EA on a substrate ST to be spaced apart from each other (S110). In an embodiment, as shown in FIG. 10A, the first electrode PE1 and the second electrode PE2 may be disposed directly on the substrate ST.

A shadow mask PR may be formed on the first electrode PE1 and the second electrode PE2 (S120). The shadow mask PR may mean a photoresist used in a shadow deposition technique. In this specification, the shadow deposition technique may mean one of photolithography techniques used in a semiconductor device process.

Figure 10B:
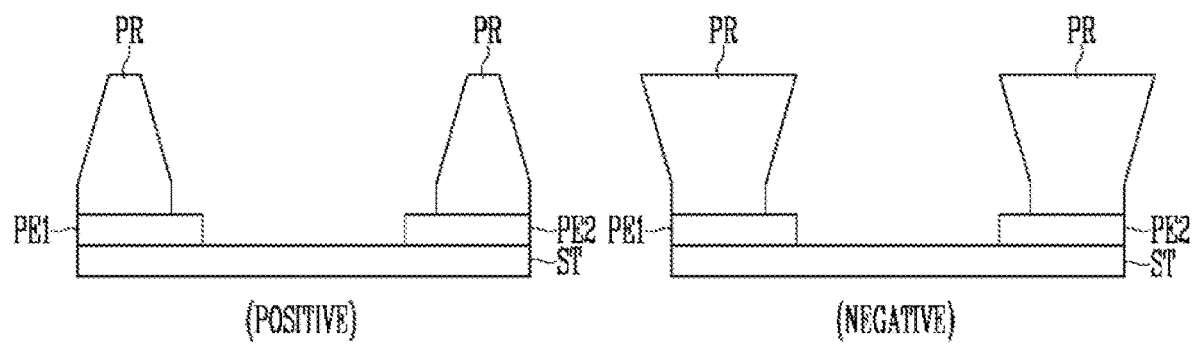

As shown in FIG. 10B, the shadow mask PR may be one of a positive photoresist and a negative photoresist. The shapes of the positive photoresist and the negative photoresist may be changed depending on characteristics of their materials. For example, the positive photoresist may have a width narrowed toward its height direction (e.g., a direction in which elements are deposited on the substrate ST such that their heights increase). On the contrary, the negative photoresist may have a width widened toward its height direction.

A light emitting element nLED may be aligned between the first electrode PE1 and the second electrode PE2 (S130). For example, when a voltage (e.g., a predetermined voltage) is applied to the first electrode PE1 and the second electrode PE2, the light emitting element nLED may be aligned such that one end of the light emitting element nLED faces the first electrode PE1 and the other end of the light emitting element nLED faces the second electrode PE2.

Figure 10C:
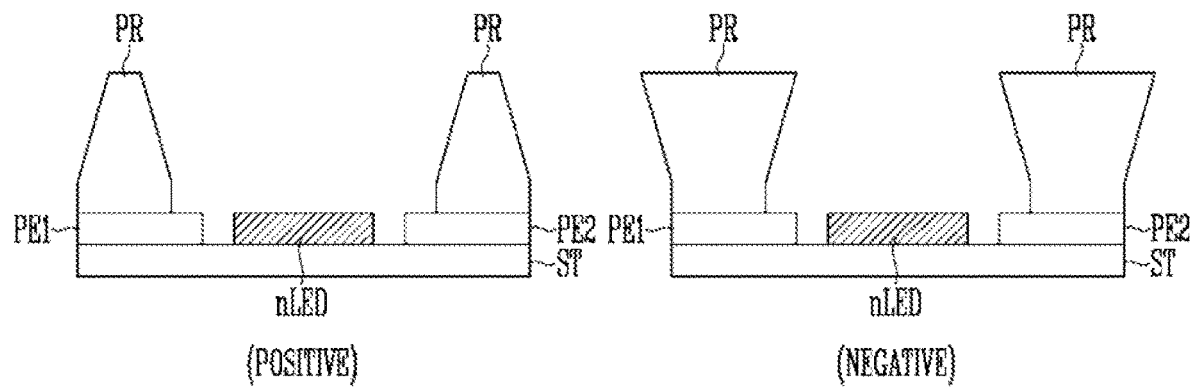

In an embodiment, as shown in FIGS. 4A, 5A, and 10C, the light emitting element nLED may be disposed directly on the substrate ST to be spaced apart from the first electrode PE1 and the second electrode PE2. However, the present disclosure is not limited thereto. As shown in FIGS. 4B and 6A, the one end of the light emitting element nLED may be disposed on the first electrode PE1, and the other end of the light emitting element nLED may be disposed on the second electrode PE2.

A first contact electrode CE1 and a second contact electrode CE2 may be formed on the first electrode PE1, the second electrode PE2, and the light emitting element nLED through the shadow deposition technique (S140).

Figure 10D:
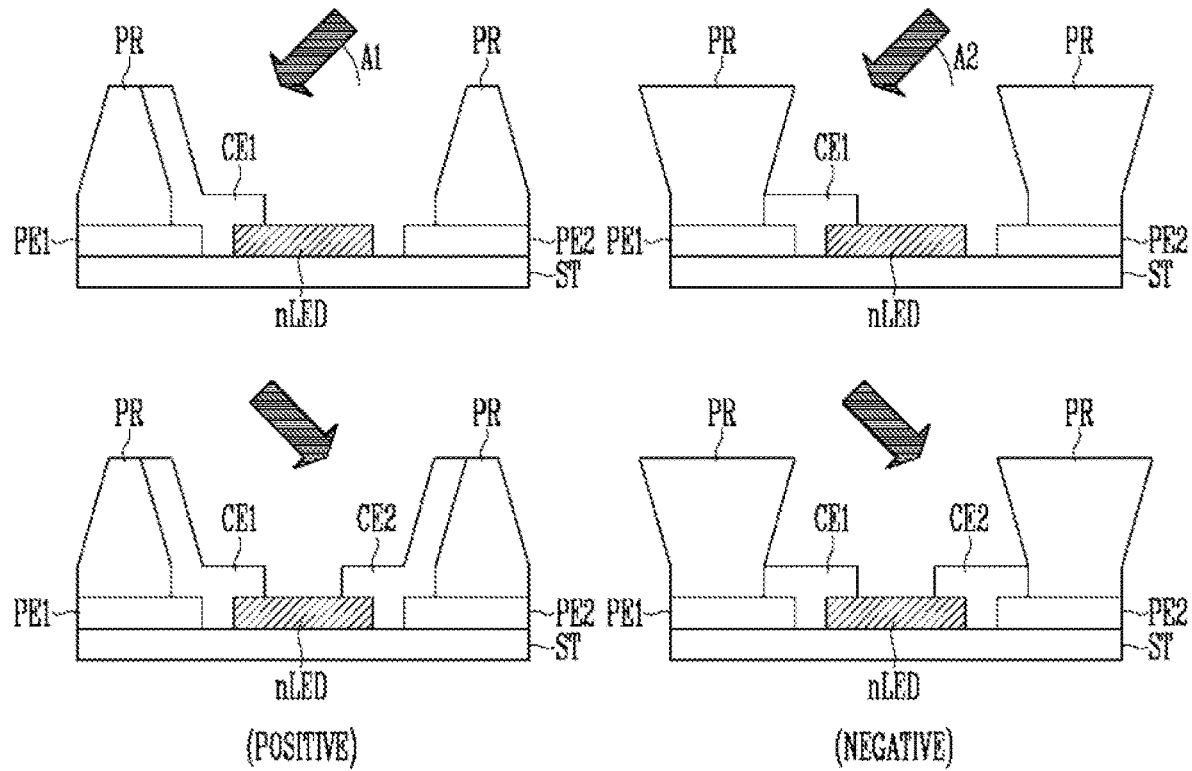

As shown in FIG. 10D, when materials constituting the first contact electrode CE1 are sprayed in an arrow direction, a partial region is covered by the shadow mask PR disposed on the second electrode PE2. Therefore, the first contact electrode CE1 may be disposed on the first electrode PE1 and the light emitting element nLED.

Similarly, when materials constituting the second contact electrode CE2 are sprayed in an arrow direction, a partial region is covered by the shadow mask PR disposed on the first electrode PE1. Therefore, the second contact electrode CE2 may be disposed on the second electrode PE2 and the light emitting element nLED.

Although FIG. 10D illustrates that the first contact electrode CE1 and the second contact electrode CE2 are sequentially formed, the present disclosure is not limited thereto. In some embodiments, the second contact electrode CE2 and the first contact electrode CE1 may be sequentially formed.

A spray direction when the positive photoresist is used may be different from that when the negative photoresist is used. For example, based on the substrate ST, a first spray angle A1 when the positive photoresist is used may be larger than a second spray angle A2 when the negative photoresist is used.

The shadow mask PR may be removed (S150). For example, the materials deposited on the shadow mask PR may be removed together with the shadow mask PR.

A protective layer PSV may be formed (S160). As shown in FIG. 5A, the protective layer PSV may be disposed over the first and second electrodes PE1 and PE2, the first and second contact electrodes CE1 and CE2, and the light emitting element nLED.

Herein, a method of fabricating a light emitting device according to an embodiment of the present disclosure, which is illustrated in FIG. 9B, will be described in further detail with reference to FIGS. 4A, 4B, 5B, 6B, 9B, and 11A to 11E.

In order to avoid redundancy, contents the same or similar to those described with respect to FIG. 9A will be omitted from the following description of FIG. 9B.

In addition, for convenience of description, a case in which a shadow mask PR is a positive photoresist is illustrated in FIGS. 11A to 11E, but the present disclosure is not limited thereto.

The method illustrated in FIG. 9B may further include a step (S100) of forming wall structures WL, as compared with the method illustrated in FIG. 9A.

Figure 11A:
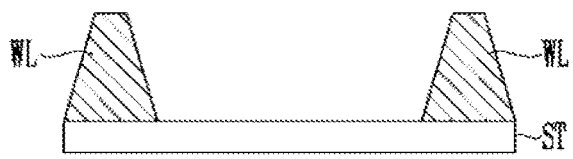

The wall structures WL may be formed on a substrate ST to be spaced apart from each other (S100). As shown in FIG. 11A, the wall structures WL may be disposed on the substrate ST to be spaced apart from each other.

Figure 11B:
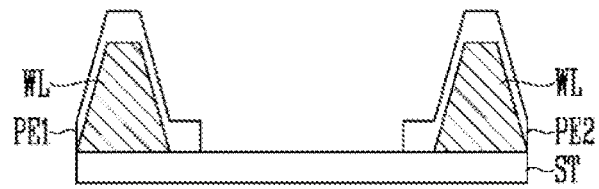

A first electrode PE1 and a second electrode PE2 may be formed in a light emitting region EA on the substrate ST to be spaced apart from each other (S110). For example, the first electrode PE1 and the second electrode PE2 may be formed to cover the wall structures WL, respectively. In an embodiment, as shown in FIG. 11B, the first electrode PE1 and the second electrode PE2 may be disposed directly on the substrate ST and the wall structures WL. In addition, the wall structures WL may be disposed between the substrate ST and the first and second electrodes PE1 and PE2, respectively. In an embodiment, the first electrode PE1 and the second electrode PE2 may entirely cover the wall structures WL.

As shown in FIG. 11C, a shadow mask PR may be formed on the first electrode PE1 and the second electrode PE2 (S120).

A light emitting element nLED may be aligned between the first electrode PE1 and the second electrode PE2 (S130).

In an embodiment, as shown in FIGS. 4A, 5B, and 11D, the light emitting element nLED may be disposed directly on the substrate ST to be spaced apart from the first electrode PE1 and the second electrode PE2. However, the present disclosure is not limited thereto. As shown in FIGS. 4B and 6B, one end of the light emitting element nLED may be disposed on the first electrode PE1, and the other end of the light emitting element nLED may be disposed on the second electrode PE2.

A first contact electrode CE1 and a second contact electrode CE2 may be formed on the first electrode PE1, the second electrode PE2, and the light emitting element nLED through a shadow deposition technique (S140).

As shown in FIG. 11E, when materials constituting the first contact electrode CE1 are sprayed in an arrow direction, a partial region is covered by the shadow mask PR disposed on the second electrode PE2. Therefore, the first contact electrode CE1 may be disposed on the first electrode PE1 and the light emitting element nLED.

Similarly, when materials constituting the second contact electrode CE2 are sprayed in an arrow direction, a partial region is covered by the shadow mask PR disposed on the first electrode PE1. Therefore, the second contact electrode CE2 may be disposed on the second electrode PE2 and the light emitting element nLED.

Although FIG. 11E illustrates that the first contact electrode CE1 and the second contact electrode CE2 are sequentially formed, the present disclosure is not limited thereto. In some embodiments, the second contact electrode CE2 and the first contact electrode CE1 may be sequentially formed.

The shadow mask PR may be removed (S150). In addition, the materials deposited on the shadow mask PR may be removed together with the shadow mask PR. For example, the first and second electrodes PE1 and PE2, the first and second contact electrodes CE1 and CE2, and the light emitting element nLED may be stacked as shown in FIG. 5B.

A protective layer PSV (see FIG. 5A) may be formed on the first and second electrodes PE1 and PE2, the first and second contact electrodes CE1 and CE2, and the light emitting element nLED (S160).

FIG. 12 is a flowchart illustrating a method of fabricating a light emitting device 100 according to an embodiment of the present disclosure.

Herein, a method of fabricating a light emitting device according to an embodiment of the present disclosure, which is illustrated in FIG. 12, will be described in further detail with reference to FIGS. 4C, 4D, 7, 8, and 10A to 10D.

In order to avoid redundancy, contents the same or similar to those described in FIG. 9A will be omitted from the following description of FIG. 12.

A first electrode PE1 and a second electrode PE2 may be formed in a light emitting region EA on a substrate ST to be spaced apart from each other (S210). In an embodiment, as shown in FIG. 10A, the first electrode PE1 and the second electrode PE2 may be disposed directly on the substrate ST.

A shadow mask PR may be formed on the first electrode PE1 and the second electrode PE2 (S220).

As shown in FIG. 10B, the shadow mask PR may be one of a positive photoresist and a negative photoresist.

A light emitting element nLED may be aligned between the first electrode PE1 and the second electrode PE2 (S230).

For example, when a voltage (e.g., a predetermined voltage) is applied to the first electrode PE1 and the second electrode PE2, the light emitting element nLED may be aligned such that one end of the light emitting element nLED faces the first electrode PE1 and the other end of the light emitting element nLED faces the second electrode PE2.

In an embodiment, as shown in FIGS. 4C, 7, and 10C, the light emitting element nLED may be disposed directly on the substrate ST to be spaced apart from the first electrode PE1 and the second electrode PE2. However, the present disclosure is not limited thereto. As shown in FIGS. 4D and 8, the one end of the light emitting element nLED may be disposed on the first electrode PE1, and the other end of the light emitting element nLED may be disposed on the second electrode PE2.

A first contact electrode CE1 and a second contact electrode CE2 may be formed on the first electrode PE1, the second electrode PE2, and the light emitting element nLED through a shadow deposition technique (S240).

As shown in FIG. 10D, when materials constituting the first contact electrode CE1 are sprayed in an arrow direction, a partial region is covered by the shadow mask PR disposed on the second electrode PE2. Therefore, the first contact electrode CE1 may be disposed on the first electrode PE1 and the light emitting element nLED.

Similarly, when materials constituting the second contact electrode CE2 are sprayed in an arrow direction, a partial region is covered by the shadow mask PR disposed on the first electrode PE1. Therefore, the second contact electrode CE2 may be disposed on the second electrode PE2 and the light emitting element nLED.

Wall structures WL may be formed on the first electrode PE1 and the second electrode PE2 (S250). As shown in FIGS. 7 and 8, the wall structures WL may be disposed on a portion of the first electrode PE1 and a portion of the second electrode PE2.

In some embodiments, the wall structures WL may be formed by thermally contracting the shadow mask PR. When heat is applied to the shadow mask PR, the shadow mask PR is contracted. That is, the heat-treated shadow mask PR may be used for the wall structures WL.

In some embodiments, the wall structures WL may be formed by dissolving the shadow mask PR. The shadow mask PR may be dissolved by a solution. That is, the remaining shadow mask PR that is not dissolved by the solution may be used for the wall structures WL.

A protective layer PSV (see FIG. 5A) may be formed over the wall structures WL, the first and second electrodes PE1 and PE2, the first and second contact electrodes CE1 and CE2, and the light emitting element nLED (S260).

FIG. 13 is a view illustrating a light emitting element nLED according to an embodiment of the present disclosure.

Although a cylindrical light emitting element nLED is illustrated in FIG. 13, the present disclosure is not limited thereto.

Referring to FIG. 13, the light emitting element nLED includes a first conductive semiconductor layer 11, a second conductive semiconductor layer 13, and an active layer 12 interposed between the first and second conductive semiconductor layers 11 and 13. In an example, the light emitting element nLED may be implemented with a stack structure in which the first conductive semiconductor layer 11, the active layer 12, and the second conductive semiconductor layer 13 are sequentially stacked.

In some embodiments, although the cylindrical light emitting element nLED is illustrated in FIG. 13, the shape of the light emitting element nLED may be variously modified and implemented. In an example, the light emitting element nLED may have any of various polygonal column shapes including a rectangular parallelepiped shape and the like. In an embodiment, the light emitting element nLED may have a rod-like shape or bar-like shape, which is long in its length direction (i.e., its aspect ratio is greater than 1).

In some embodiments, the light emitting element nLED may further include an insulating film 14.

Also, in some embodiments, the light emitting element nLED may further include first and second electrodes.

The first electrode may be electrically connected to the first conductive semiconductor layer 11, and the second electrode may be electrically connected to the second conductive semiconductor layer 13.

For example, the first electrode may be electrically connected to the light emitting element nLED through one surface of the first conductive semiconductor layer 11 (e.g., a lower surface of the light emitting element nLED in FIG. 13), which is not covered by the insulating film 14, and the second electrode may be electrically connected to the light emitting element nLED through one surface of the second conductive semiconductor layer 13 (e.g., an upper surface of the light emitting element nLED in FIG. 13), which is not covered by the insulating film 14.

In some embodiments, a contact electrode (not shown) may be further included between the first electrode and the first conductive semiconductor layer 11 and/or between the second electrode and the second conductive semiconductor layer 13.

Also, in some embodiments, the insulating film 14 may expose at least one region among sides of the first conductive semiconductor layer 11 and/or the second conductive semiconductor layer 13. That is, in the embodiment of the present disclosure, whether the insulating film 14 is included and/or the position of the insulating film 14 is not particularly limited.

In an embodiment, the light emitting element nLED may be fabricated small enough to have a diameter and/or a length, for example, to a degree of micro or nano scale. However, the size of the light emitting element nLED according to the embodiment of the present disclosure is not limited thereto, and the size of the light emitting element nLED may be changed to correspond to required conditions of a light emitting device to which the light emitting element nLED is applied.

The first conductive semiconductor layer 11 may include, for example, at least one n-type semiconductor layer. For example, the first conductive semiconductor layer 11 may include at least one semiconductor material among InAlGaN, GaN, AlGaN, InGaN, AlN, and InN, and include a semiconductor layer doped with a first conductive dopant, such as Si, Ge or Sn. However, the material constituting the first conductive semiconductor layer 11 is not limited thereto, and any of various materials may be included in the first conductive semiconductor layer 11.

The active layer 12 is formed on the first conductive semiconductor layer 11, and may be formed in a single or multiple quantum well structure. In some embodiments, a clad layer (not shown) doped with a conductive dopant may be formed on the top and/or the bottom of the active layer 12. In an example, the clad layer may be implemented as an AlGaN layer or InAlGaN layer. In addition, it will be apparent that a material such as AlGaN or AlInGaN may also be used for the active layer 12. When an electric field having a voltage (e.g., a predetermined voltage) or more is applied to both ends of the light emitting element nLED, the light emitting element nLED emits light as electron-hole pairs are combined in the active layer 12.

The second conductive semiconductor layer 13 is formed on the active layer 12, and may include a semiconductor layer having a type different from that of the first conductive semiconductor layer 11. In an example, the second conductive semiconductor layer 13 may include at least one p-type semiconductor layer. For example, the second conductive semiconductor layer 13 may include at least one semiconductor material among InAlGaN, GaN, AlGaN, InGaN, AlN, and InN, and include a semiconductor layer doped with a second conductive dopant, such as Mg. However, the material constituting the second conductive semiconductor layer 13 is not limited thereto, and any of various materials may be included in the second conductive semiconductor layer 13.

In some embodiments, the light emitting element nLED may further include another phosphor layer, another active layer, another semiconductor layer, and/or another electrode layer on the top and/or the bottom of each layer, in addition to the first conductive semiconductor layer 11, the active layer 12, and the second conductive semiconductor layer 13. Also, the light emitting element nLED may further include the insulating film 14. However, in some embodiments, the insulating film 14 may be omitted.

The insulating film 14 is formed to surround at least a portion of outer circumferential surfaces of the first conductive semiconductor layer 11, the active layer 12, and/or the second conductive semiconductor layer 13. In an example, the insulating film 14 may be formed to surround at least the outer circumferential surface of the active layer 12. In some embodiments, the insulating film 14 may be formed of a transparent insulating material. For example, the insulating film 14 may include at least one insulating material selected from the group consisting of $SiO_2$, $Si_3N_4$, $Al_2O_3$, and $TiO_2$. However, the present invention is not limited thereto.

When the insulating film 14 is formed, the active layer 12 can prevented or substantially prevented from being short circuited with the first electrode (not shown) and/or the second electrode (not shown). Further, when the insulating film 14 is formed, a surface defect of the light emitting element nLED may be minimized or reduced, such that the life span and efficiency of the light emitting element nLED can be improved. Further, when a plurality of light emitting elements nLED are densely disposed, the insulating film 14 can prevent or substantially prevent an unwanted short circuit that may occur between the light emitting elements nLED.

The above-described light emitting element nLED may be used as a light emitting source for any of various display devices. In an example, the light emitting element nLED may be used as a light emitting source of a lighting device or self-luminescent display panel.

According to an aspect, in the light emitting device and the method of fabricating the same according to the present disclosure, the pixel has a symmetric structure, such that an image having enhanced image quality can be displayed.

Further, in the light emitting device and the method of fabricating the same according to the present disclosure, the fabrication process can be improved.

Some example embodiments have been disclosed herein, and although specific terms are employed, they are used and are to be interpreted in a generic and descriptive sense and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments, unless otherwise specifically indicated. Accordingly, it will be understood by those of skill in the art that various changes in form and details may be made without departing from the spirit and scope of the present disclosure as set forth in the following claims.

What is claimed is:

1. A method of fabricating a light emitting device, the method comprising:
    forming wall structures on a substrate;
    forming a first electrode and a second electrode in a light emitting region on the substrate to be spaced apart from each other;
    forming a shadow mask on the first electrode and the second electrode;
    aligning a light emitting element between the first electrode and the second electrode;
    forming a first contact electrode and a second contact electrode through shadow deposition using the shadow mask; and
    removing the shadow mask,
    wherein the wall structures are respectively between the substrate and the first electrode and between the substrate and the second electrode,
    wherein the first electrode is formed on side surfaces of a wall structure of the wall structures that face away from each other, and
    wherein forming the first electrode and the second electrode is performed after forming the wall structures.

2. The method of claim 1, wherein the first electrode and the second electrode entirely cover the wall structures.

3. The method of claim 1, wherein an end of the light emitting element is on the first electrode, and another end of the light emitting element is on the second electrode.

4. The method of claim 1, further comprising forming a protective layer configured to protect the first electrode, the second electrode, the first contact electrode, the second contact electrode, and the light emitting element.

5. The method of claim 1, wherein a wall thickness of the wall structures is greater than a thickness of the first electrode, and wherein the wall thickness is defined in a thickness direction of the substrate.

* * * * *